United States Patent
Lin et al.

(10) Patent No.: US 10,425,108 B2
(45) Date of Patent: Sep. 24, 2019

(54) TAILLESS CONVOLUTIONAL CODES

(71) Applicant: QUALCOMM Incorporated, San Diego, CA (US)

(72) Inventors: Jamie Menjay Lin, San Diego, CA (US); Yang Yang, San Diego, CA (US); Joseph Binamira Soriaga, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 89 days.

(21) Appl. No.: 15/612,820

(22) Filed: Jun. 2, 2017

(65) Prior Publication Data

US 2017/0359089 A1    Dec. 14, 2017

Related U.S. Application Data

(60) Provisional application No. 62/349,521, filed on Jun. 13, 2016.

(51) Int. Cl.
*H03M 13/23* (2006.01)
*H03M 13/29* (2006.01)
(Continued)

(52) U.S. Cl.
CPC ......... *H03M 13/235* (2013.01); *H03M 13/09* (2013.01); *H03M 13/2927* (2013.01);
(Continued)

(58) Field of Classification Search
CPC ......... H04L 1/00; H04L 1/0059; H04L 1/006; H03M 13/235; H03M 13/2927;
(Continued)

(56) References Cited

U.S. PATENT DOCUMENTS

| 5,881,073 A | 3/1999 | Wan et al. |
| 6,108,386 A | 8/2000 | Chen et al. |

(Continued)

FOREIGN PATENT DOCUMENTS

| EP | 1339188 A1 | 8/2003 |
| WO | WO-9927745 A1 | 6/1999 |

OTHER PUBLICATIONS

Chen B., et al., "List Viterbi Algorithms for Continuous Transmission", IEEE Transactions on Communications, vol. 49 No. 5, pp. 784-792, May 2001.

(Continued)

*Primary Examiner* — Betsy Deppe
(74) *Attorney, Agent, or Firm* — Patterson & Sheridan, LLP

(57) ABSTRACT

Certain aspects of the present disclosure relate to techniques and apparatus for increasing decoding performance and/or reducing decoding complexity. An exemplary method generally includes receiving, via a wireless medium, a codeword encoded using a tailless convolutional code (TLCC) with a known start state, evaluating a set of decoding candidate paths through a trellis decoder that originate at the known start state of the TLCC, performing, for each of a plurality of the decoding candidate paths, a back trace from a respective end state to the known start state, and selecting one of the decoding candidate paths based, at least in part, on path metrics generated while performing the back trace. Other aspects, embodiments, and features are also claimed and described.

26 Claims, 11 Drawing Sheets

(51) Int. Cl.
  *H04L 1/00*   (2006.01)
  *H03M 13/09*  (2006.01)
  *H03M 13/37*  (2006.01)
  *H03M 13/41*  (2006.01)

(52) U.S. Cl.
  CPC ... *H03M 13/3738* (2013.01); *H03M 13/4115* (2013.01); *H03M 13/4169* (2013.01); *H04L 1/00* (2013.01); *H04L 1/006* (2013.01)

(58) Field of Classification Search
  CPC ............ H03M 13/09; H03M 13/3738; H03M 13/4169; H03M 13/4115; H03M 13/2939
  USPC ......... 714/786, 792, 795; 375/262, 265, 341
  See application file for complete search history.

(56) References Cited

U.S. PATENT DOCUMENTS

| | | | |
|---|---|---|---|
| 6,141,388 A | 10/2000 | Servais et al. | |
| 6,304,612 B1 | 10/2001 | Baggen et al. | |
| 2012/0028684 A1 | 2/2012 | Miyoshi et al. | |
| 2012/0036416 A1* | 2/2012 | Wang ................ | H03M 13/4115 714/795 |

OTHER PUBLICATIONS

International Search Report and Written Opinion—PCT/US2017/035858—ISA/EPO—dated Sep. 14, 2017.
Mohammad M., et al., "Comparing List Viterbi Algorithms with and without Tail Bits", Proc. 2008 Military Communications Conference (MILCOM), IEEE, Piscataway, NJ, USA, Nov. 16, 2008 (Nov. 16, 2008), XP031408097, pp. 1-6.

* cited by examiner

Convolutional Code (CC)

Information bit stream:   1 1 0 0 1 0 1 0
Encoding process:  [0 0 0 1] 1 0 0 1 0 1 0 0 0 0 → coded bit 1,2,3
                    0 [0 0 1 1] 0 0 1 0 1 0 0 0 0 → coded bit 4,5,5
                    0 0 [0 1 1 0] 0 1 0 1 0 0 0 0 → coded bit 7,8,9
                    0 0 0 [1 1 0 0] 1 0 1 0 0 0 0 → coded bit 10,11,12

0 0 0 1 1 0 0 1 0 1 [0 0 0 0] → coded bit 31,32,33

Viterbi Algorithm For CC

Viterbi Algorithm For TBCC (cont')

1. Start with equal weight for each state in the first iteration
2. At the end of the trellis construction, identify a number of best states
3. Take the back trace output over a certain range of stages for the decoded bits

| Code | # of possible start states at decoder | # of possible end states at decoder | # of possible combinations for start and end states at decoder |
|---|---|---|---|
| CC | 1 | 1 | 1 |
| TBCC | 64 | 64 | 64^2 |
| TLCC | 1 | 64 | 64 |

FIG. 12

Tailless Convolutional Code (CC)
(assuming "0" start state)

Information bit stream: 1 1 0 0 1 0 1 0

Encoding process: [0 0 0 1] 1 0 0 1 0 1 0 → coded bit 1,2,3
0 [0 0 1 1] 0 0 1 0 1 0 → coded bit 4,5,5
0 0 [0 1 1 0] 0 1 0 1 0 → coded bit 7,8,9
0 0 0 [1 1 0 0] 1 0 1 0 → coded bit 10,11,12
⋮                        ⋮
0 0 0 1 1 0 0 [1 0 1 0] → coded bit 22,23,24

TAILLESS CONVOLUTIONAL CODES

CLAIM OF PRIORITY UNDER 35 U.S.C. § 119

This application claims benefit of U.S. Provisional Patent Application Ser. No. 62/349,521, filed Jun. 13, 2016, which is herein incorporated by reference in its entirety for all applicable purposes as if fully set forth below.

TECHNICAL FIELD

Certain aspects of the present disclosure generally relate to wireless communications and, more particularly, to a method and apparatus for encoding and decoding tailless convolutional codes (TLCCs).

INTRODUCTION

In a transmitter of all modern wireless communication links, an output sequence of bits from an error correcting code can be mapped onto a sequence of complex modulation symbols. These symbols can be then used to create a waveform suitable for transmission across a wireless channel. Particularly as data rates increase, decoding performance on the receiver side can be a limiting factor to achievable data rates.

BRIEF SUMMARY OF SOME EMBODIMENTS

The following summarizes some aspects of the present disclosure to provide a basic understanding of the discussed technology. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

Aspects of the present disclosure provide a new type of convolutional code known as a Tailless Convolutional Code (TLCC). TLCCs are associated with certain properties that reduce decoder complexity. For example, TLCCs start with a known start state that is not a function of the code's end state. Further, TLCCs do not have a tail-biting requirement, like other types of convolutional codes, that requires tail bits of an encoded stream of bits to be appended to the start of the encoded stream of bits.

Certain aspects provide a method for wireless communications. The method generally includes receiving, via a wireless medium, a codeword encoded using a tailless convolutional code (TLCC) with a known start state, evaluating a set of decoding candidate paths through a trellis decoder that originate at the known start state of the TLCC, performing, for each of a plurality of the decoding candidate paths, a back trace from a respective end state to the known start state, and selecting one of the decoding candidate paths based, at least in part, on path metrics generated while performing the back trace.

Certain aspects provide an apparatus for wireless communications. The apparatus generally includes at least one processor configured to receive, via a wireless medium, a codeword encoded using a tailless convolutional code (TLCC) with a known start state, evaluate a set of decoding candidate paths through a trellis decoder that originate at the known start state of the TLCC, perform, for each of a plurality of the decoding candidate paths, a back trace from a respective end state to the known start state, and select one of the decoding candidate paths based, at least in part, on path metrics generated while performing the back trace. The apparatus also generally includes a memory coupled with the at least one processor.

Certain aspects provide an apparatus for wireless communications. The apparatus generally includes means for receiving, via a wireless medium, a codeword encoded using a tailless convolutional code (TLCC) with a known start state, means for evaluating a set of decoding candidate paths through a trellis decoder that originate at the known start state of the TLCC, means for performing, for each of a plurality of the decoding candidate paths, a back trace from a respective end state to the known start state, and means for selecting one of the decoding candidate paths based, at least in part, on path metrics generated while performing the back trace.

Certain aspects provide a non-transitory computer-readable medium for wireless communications. The non-transitory computer-readable medium generally includes code for receiving, via a wireless medium, a codeword encoded using a tailless convolutional code (TLCC) with a known start state, evaluating a set of decoding candidate paths through a trellis decoder that originate at the known start state of the TLCC, performing, for each of a plurality of the decoding candidate paths, a back trace from a respective end state to the known start state, and selecting one of the decoding candidate paths based, at least in part, on path metrics generated while performing the back trace.

The techniques may be embodied in methods, apparatuses, and computer program products. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 12 illustrates a comparison between convolutional codes, tail-biting convolutional codes, and tailless convolutional codes, in accordance with certain aspects of the present disclosure.

DETAILED DESCRIPTION

Figure 1:
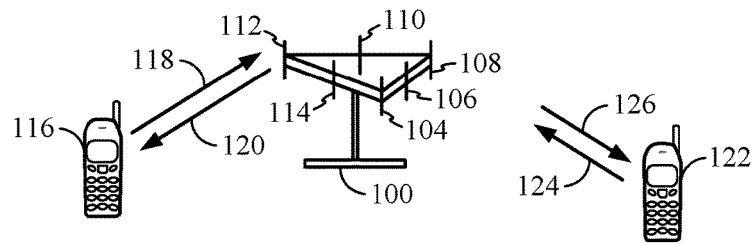
FIG. 1 illustrates an example wireless communication system in accordance with certain aspects of the present disclosure.

Aspects of the present disclosure provide a new type of convolutional code, known as a Tailless Convolutional Code (TLCC). TLCC coding provides and enables efficient decoding and reduced decoder complexity. For example, TLCCs reduce decoder complexity by not having a tail-biting requirement, like other types of convolutional codes, that requires tail bits of an encoded stream of bits to be appended to the start of the encoded stream of bits. Further, TLCCs reduce decoder complexity by limiting the number of starting states to a single, known starting state. For example, instead of having M×N different combinations of starting and ending states like other types of convolutional codes, due to having a single known starting state, the number of possible starting state and ending state combinations is limited to, for example, N (e.g., 64 for LTE).

An Example Wireless Communication System

The techniques described herein may be used for various wireless communication networks such as Orthogonal Frequency Division Multiplexing (OFDM) networks, Time Division Multiple Access (TDMA) networks, Frequency Division Multiple Access (FDMA) networks, Orthogonal FDMA (OFDMA) networks, Single-Carrier FDMA (SC-FDMA) networks, Code Division Multiple Access (CDMA) networks, etc. The terms "networks" and "systems" are often used interchangeably. A CDMA network may implement a radio technology such as Universal Terrestrial Radio Access (UTRA), CDMA2000, etc. UTRA includes Wideband-CDMA (W-CDMA) and Low Chip Rate (LCR). CDMA2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16 (e.g., WiMAX (Worldwide Interoperability for Microwave Access)), IEEE 802.20, Flash-OFDM®, etc. UTRA, E-UTRA, and GSM are part of Universal Mobile Telecommunication System (UMTS). Long Term Evolution (LTE) and Long Term Evolution Advanced (LTE-A) are upcoming releases of UMTS that use E-UTRA. UTRA, E-UTRA, GSM, UMTS and LTE are described in documents from an organization named "3rd Generation Partnership Project" (3GPP). CDMA2000 is described in documents from an organization named "3rd Generation Partnership Project 2" (3GPP2). CDMA2000 is described in documents from an organization named "3rd Generation Partnership Project 2" (3GPP2). These various radio technologies and standards are known in the art. For clarity, certain aspects of the techniques are described below for LTE and LTE-A.

The teachings herein may be incorporated into (e.g., implemented within or performed by) a variety of wired or wireless apparatuses (e.g., nodes). In some aspects a node comprises a wireless node. Such wireless node may provide, for example, connectivity for or to a network (e.g., a wide area network such as the Internet or a cellular network) via a wired or wireless communication link. In some aspects, a wireless node implemented in accordance with the teachings herein may comprise an access point or an access terminal.

An access point ("AP") may comprise, be implemented as, or known as NodeB, Radio Network Controller ("RNC"), eNodeB, Base Station Controller ("BSC"), Base Transceiver Station ("BTS"), Base Station ("BS"), Transceiver Function ("TF"), Radio Router, Radio Transceiver, Basic Service Set ("BSS"), Extended Service Set ("ESS"), Radio Base Station ("RBS"), or some other terminology. In some implementations an access point may comprise a set top box kiosk, a media center, or any other suitable device that is configured to communicate via a wireless or wired medium.

An access terminal ("AT") may comprise, be implemented as, or known as an access terminal, a subscriber station, a subscriber unit, a mobile station, a remote station, a remote terminal, a user terminal, a user agent, a user device, user equipment, a user station, or some other terminology. In some implementations an access terminal may comprise a cellular telephone, a cordless telephone, a Session Initiation Protocol ("SIP") phone, a wireless local loop ("WLL") station, a personal digital assistant ("PDA"), a handheld device having wireless connection capability, a Station ("STA"), or some other suitable processing device connected to a wireless modem. Accordingly, one or more aspects taught herein may be incorporated into a phone (e.g., a cellular phone or smart phone), a computer (e.g., a laptop), a portable communication device, a portable computing device (e.g., a personal data assistant), a tablet, an entertainment device (e.g., a music or video device, or a satellite radio), a television display, a flip-cam, a security video camera, a digital video recorder (DVR), a global positioning system device, sensor, industrial equipment, medical devices, implantable devices, wearables, mammal implant devices, vehicles or vehicular components, drones, internet of things devices, or any other suitable device that is configured to communicate via a wireless or wired medium.

Referring to FIG. 1, a multiple access wireless communication system according to one aspect is illustrated. In an aspect of the present disclosure, the wireless communication system from FIG. 1 may be a wireless mobile broadband system based on Orthogonal Frequency Division Multiplexing (OFDM). An access point (AP) 100 may include multiple antenna groups, one group including antennas 104 and 106, another group including antennas 108 and 110, and an additional group including antennas 112 and 114. In FIG. 1, only two antennas are shown for each antenna group, however, more or fewer antennas may be utilized for each antenna group. Access terminal 116 (AT) may be in communication with antennas 112 and 114, where antennas 112 and 114 transmit information to access terminal 116 over forward link 120 and receive information from access terminal 116 over reverse link 118. Access terminal 122 may be in communication with antennas 106 and 108, where antennas 106 and 108 transmit information to access terminal 122 over forward link 126 and receive information from access terminal 122 over reverse link 124. In a FDD system, communication links 118, 120, 124 and 126 may use different frequency for communication. For example, forward link 120 may use a different frequency then that used by reverse link 118.

Each group of antennas and/or the area in which they are designed to communicate is often referred to as a sector of the access point. In one aspect of the present disclosure each antenna group may be designed to communicate to access terminals in a sector of the areas covered by access point 100.

In communication over forward links 120 and 126, the transmitting antennas of access point 100 may utilize beamforming in order to improve the signal-to-noise ratio of forward links for the different access terminals 116 and 122. Also, an access point using beamforming to transmit to access terminals scattered randomly through its coverage causes less interference to access terminals in neighboring cells than an access point transmitting through a single antenna to all its access terminals.

Figure 2:
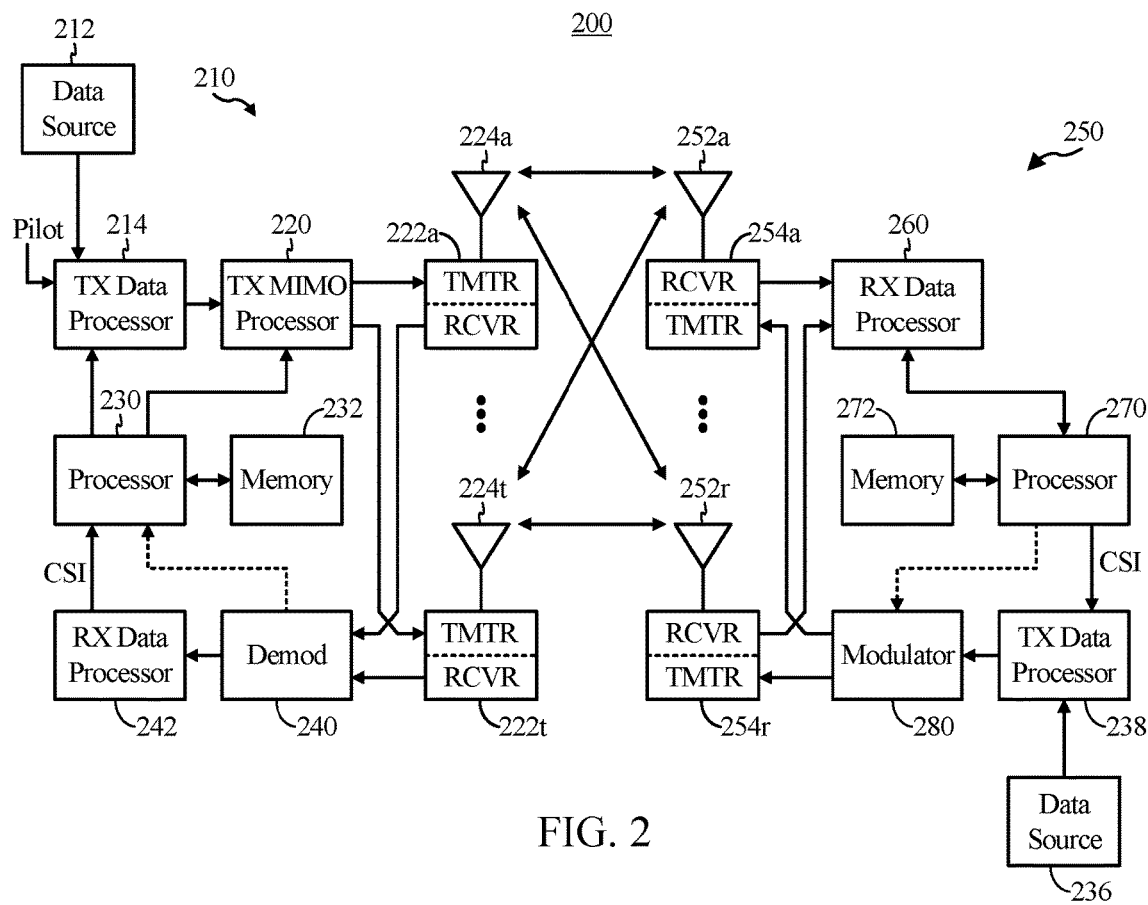
FIG. 2 illustrates a block diagram of an access point and a user terminal in accordance with certain aspects of the present disclosure.

FIG. 2 illustrates a block diagram of an aspect of a transmitter system 210 (e.g., also known as the access point/base station) and a receiver system 250 (e.g., also known as the access terminal) in a wireless communications system, for example, a MIMO system 200, in which aspects of the present disclosure may be practiced. At the transmitter system 210, traffic data for a number of data streams is provided from a data source 212 to a transmit (TX) data processor 214.

In one aspect of the present disclosure, each data stream may be transmitted over a respective transmit antenna. TX data processor 214 formats, codes, and interleaves the traffic data for each data stream based on a particular coding scheme (e.g., a tailless convolutional code) selected for that data stream to provide coded data.

Coded data for each data stream may be multiplexed with pilot data using OFDM techniques. The pilot data is typically a known data pattern that is processed in a known manner and may be used at the receiver system to estimate the channel response. The multiplexed pilot and coded data for each data stream is then modulated (i.e., symbol mapped) based on a particular modulation scheme (e.g., BPSK, QPSK, m-QPSK, or m-QAM) selected for that data stream to provide modulation symbols. The data rate, coding, and modulation for each data stream may be determined by instructions performed by processor 230.

The modulation symbols for all data streams are then provided to a TX MIMO processor 220, which may further process the modulation symbols (e.g., for OFDM). TX MIMO processor 220 then provides $N_T$ modulation symbol streams to $N_T$ transmitters (TMTR) 222a through 222t. In certain aspects of the present disclosure, TX MIMO processor 220 applies beamforming weights to the symbols of the data streams and to the antenna from which the symbol is being transmitted.

Each transmitter 222 receives and processes a respective symbol stream to provide one or more analog signals, and further conditions (e.g., amplifies, filters, and upconverts) the analog signals to provide a modulated signal suitable for transmission over the MIMO channel. $N_T$ modulated signals from transmitters 222a through 222t are then transmitted from $N_T$ antennas 224a through 224t, respectively.

At receiver system 250, the transmitted modulated signals may be received by $N_R$ antennas 252a through 252r and the received signal from each antenna 252 may be provided to a respective receiver (RCVR) 254a through 254r. Each receiver 254 may condition (e.g., filters, amplifies, and downconverts) a respective received signal, digitize the conditioned signal to provide samples, and further process the samples to provide a corresponding "received" symbol stream.

An RX data processor 260 then receives and processes the $N_R$ received symbol streams from $N_R$ receivers 254 based on a receiver processing technique to provide $N_T$ "detected" symbol streams. The RX data processor 260 then demodulates, deinterleaves, and decodes (e.g., by implementing example operations 1100 illustrated in FIG. 11) each detected symbol stream to recover the traffic data for the data stream. The processing by RX data processor 260 may be complementary to that performed by TX MIMO processor 220 and TX data processor 214 at transmitter system 210.

A processor 270 periodically determines which pre-coding matrix to use. Processor 270 formulates a reverse link message comprising a matrix index portion and a rank value portion. The reverse link message may comprise various types of information regarding the communication link and/or the received data stream. The reverse link message is then processed by a TX data processor 238, which also receives traffic data for several data streams from a data source 236, modulated by a modulator 280, conditioned by transmitters 254a through 254r, and transmitted back to transmitter system 210.

At transmitter system 210, the modulated signals from receiver system 250 are received by antennas 224, conditioned by receivers 222, demodulated by a demodulator 240, and processed by a RX data processor 242 to extract the reserve link message transmitted by the receiver system 250. Processor 230 then determines which pre-coding matrix to use for determining the beamforming weights, and then processes the extracted message.

Figure 3:
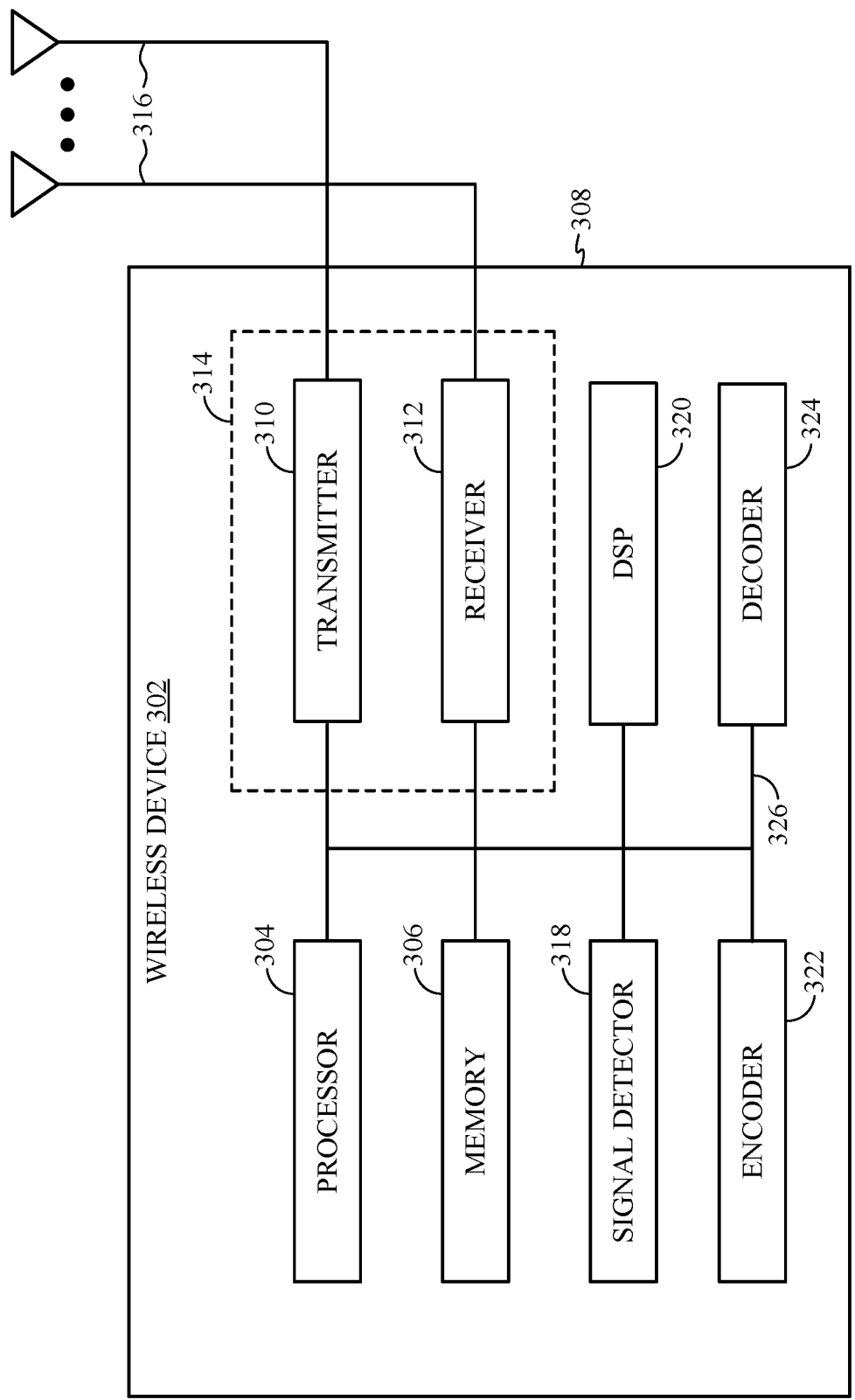
FIG. 3 illustrates a block diagram of an example wireless device in accordance with certain aspects of the present disclosure.

FIG. 3 illustrates various components that may be utilized in a wireless device 302 that may be employed within the wireless communication system from FIG. 1. The wireless device 302 is an example of a device that may be configured to implement the various methods described herein. For example, in some cases, the wireless communications device may be configured to obtain a payload to be transmitted, partition the payload into a plurality of sections, derive redundancy check information for each section of the plurality of sections, merge the redundancy check information for each section with the plurality of sections to form a sequence of bits, and generate a codeword by encoding the sequence of bits using an encoder, as described in greater detail below. In other cases, the wireless device may be configured to receive a codeword comprising a plurality of payload sections, decode the plurality of payload sections of the codeword, and verifying each decoded payload section of the plurality of payload sections based on redundancy check information corresponding to that decoded payload section, as described in greater detail below. According to certain aspects, the wireless device 302 may be an access point 100 from FIG. 1 or any of access terminals 116, 122.

The wireless device 302 may include a processor 304 which controls operation of the wireless device 302. The processor 304 may also be referred to as a central processing unit (CPU). Memory 306, which may include both read-only memory (ROM) and random access memory (RAM), provides instructions and data to the processor 304. A portion of the memory 306 may also include non-volatile random access memory (NVRAM). The processor 304 typically performs logical and arithmetic operations based on program instructions stored within the memory 306. The instructions in the memory 306 may be executable to implement the methods described herein.

The wireless device 302 may also include a housing 308 that may include a transmitter 310 and a receiver 312 to allow transmission and reception of data between the wireless device 302 and a remote location. The transmitter 310 and receiver 312 may be combined into a transceiver 314. A single, or a plurality of, transmit antennas 316 may be attached to the housing 308 and electrically coupled to the transceiver 314. The wireless device 302 may also include (not shown) multiple transmitters, multiple receivers, and multiple transceivers.

The wireless device 302 may also include a signal detector 318 that may be used to detect and quantify the level of signals received by the transceiver 314. The signal detector 318 may detect such signals as total energy, energy per subcarrier per symbol, power spectral density and other signals. The wireless device 302 may also include a digital signal processor (DSP) 320 for use in processing signals.

Additionally, the wireless device may also include an encoder 322 for use in encoding signals for transmission and a decoder 324 for use in decoding received signals. According to certain aspects, the encoder 322 may perform encoding according to certain aspects presented herein (e.g., by encoding a stream of bits using a tailless convolutional code, as described in greater detail below). Additional details of the encoder 322 will be described in greater detail below. According to certain aspects, the decoder 324 may perform decoding according to certain aspects presented herein (e.g., by implementing operations 1100 illustrated in FIG. 11). Additional details of the decoder 324 will be described in greater detail below.

The various components of the wireless device 302 may be coupled together by a bus system 326, which may include a power bus, a control signal bus, and a status signal bus in addition to a data bus. The processor 304 may be configured to access instructions stored in the memory 306 to perform connectionless access, in accordance with aspects of the present disclosure discussed below.

Figure 4:
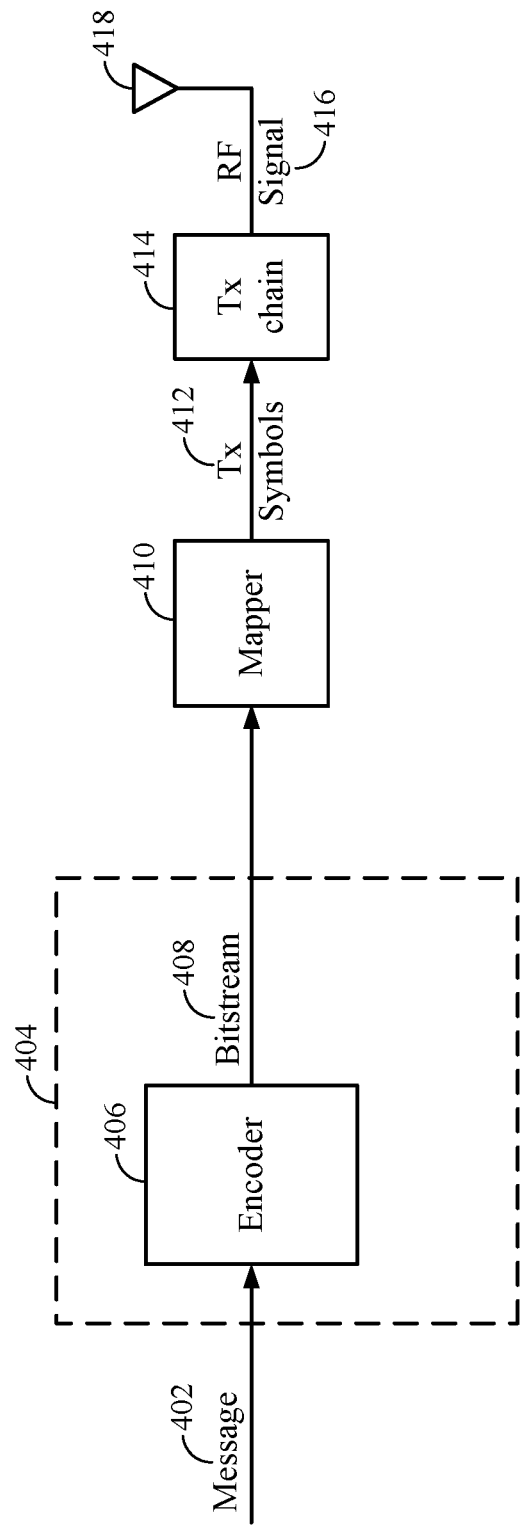
FIG. 4 is a block diagram illustrating an encoder, in accordance with certain aspects of the present disclosure.

FIG. 4 illustrates a portion of a radio frequency (RF) modem 404 that may be configured to provide an encoded message for wireless transmission. In one example, an encoder 406 in a base station (e.g., AP 100 and/or 210) (or an access terminal on the reverse path, such as 116 and/or 250) receives a message 402 for transmission. The message 402 may contain data and/or encoded voice or other content directed to the receiving device. The encoder 406 (which may correspond to the encoder 322 of the wireless device 302) encodes the message using a suitable modulation and coding scheme (MCS), typically selected based on a configuration defined by the base station 100/210 or another network entity.

In some cases, the encoder 406 may encode the message using techniques described below (e.g., by using a tailless convolutional code (TLCC) with a known start state, as described below). For example, in some cases, the encoder 406 may obtain a payload to be transmitted and may encode the payload using a TLCC to generate a codeword for transmission. In some cases, the encoder may include an error check value (e.g., a cyclic redundancy check) in the payload that may be used by a decoder (e.g., decoder 516) to verify that the codeword was decoded properly. Additionally, in some cases, additional CRC bits (e.g., C' bits) may be included in the CRC such that the total number of CRC bits is increased and an error check capability against false alarm rates may be increased as well.

According to aspects, encoded bitstream 408 produced by the encoder 406 may then be provided to a mapper 410 that generates a sequence of Tx symbols 412 that are modulated, amplified and otherwise processed by Tx chain 414 to produce an RF signal 416 for transmission through antenna 418.

Figure 5:
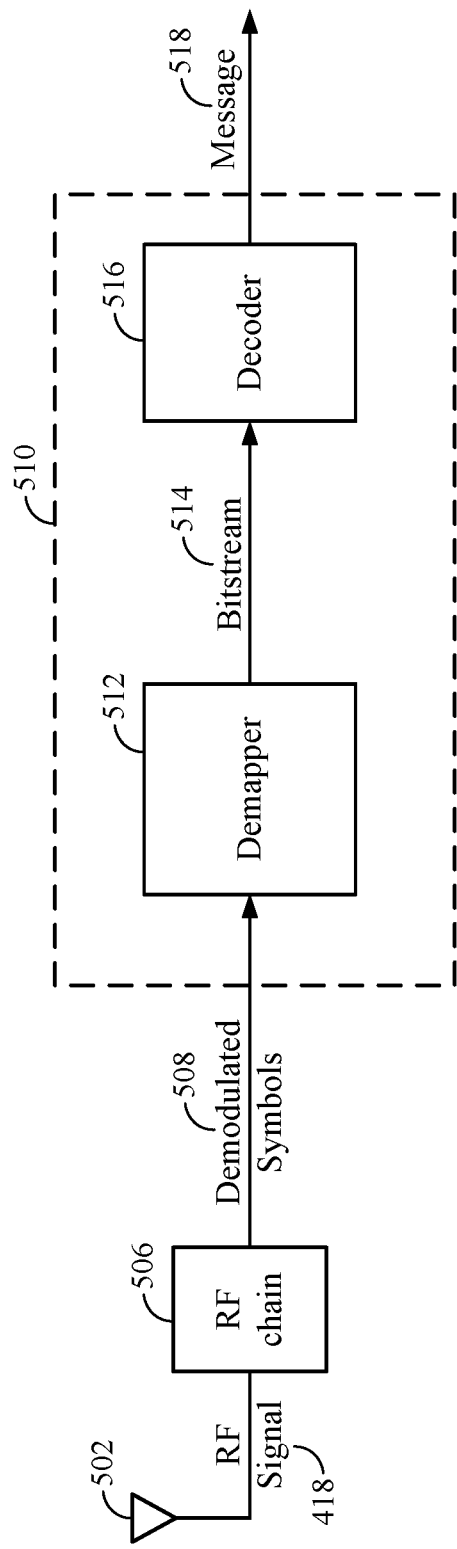
FIG. 5 is a block diagram illustrating a decoder, in accordance with certain aspects of the present disclosure.

FIG. 5 illustrates a portion of a RF modem 510 that may be configured to receive and decode a wirelessly transmitted signal including an encoded message (e.g., a codeword encoded using a tailless convolutional code (TLCC) with a known start state, as described below). In various examples, the modem 510 receiving the signal may reside at the access terminal, at the base station, or at any other suitable apparatus or means for carrying out the described functions. An antenna 502 provides an RF signal 416 (i.e., the RF signal produced in FIG. 4) to an access terminal (e.g., access terminal 116, 122, and/or 250). An RF chain 506 processes and demodulates the RF signal 416 and may provide a sequence of symbols 508 to a demapper 512, which produces a bitstream 514 representative of the encoded message.

A decoder 516 (which may correspond to the decoder 324 of the wireless device 302) may then be used to decode m-bit information strings from a bitstream that has been encoded using a coding scheme (e.g., a TBCC encoding scheme, a Polar code encoding scheme, TLCC encoding scheme, etc.). The decoder 516 may comprise a Viterbi decoder, an algebraic decoder, a butterfly decoder, or another suitable decoder. In one example, a Viterbi decoder employs the well-known Viterbi algorithm to find the most likely sequence of signaling states (the Viterbi path) that corresponds to a received bitstream 514. The bitstream 514 may be decoded based on a statistical analysis of LLRs calculated for the bitstream 514. In one example, a Viterbi decoder may compare and select the correct Viterbi path that defines a sequence of signaling states using a likelihood ratio test to generate LLRs from the bitstream 514. Likelihood ratios can be used to statistically compare the fit of a plurality of candidate Viterbi paths using a likelihood ratio test that compares the logarithm of a likelihood ratio for each candidate Viterbi path (i.e. the LLR) to determine which path is more likely to account for the sequence of symbols that produced the bitstream 514. The decoder 516 may then decode the bitstream 514 based on the LLRs to determine the message 518 containing data and/or encoded voice or other content transmitted from the base station (e.g., AP 100 and/or 210).

According to aspects, the decoder may decode the bitsteam 514 in accordance with aspects of the present disclosure presented below (e.g., by implementing operations 1100 illustrated in FIG. 13). For example, in some cases, the decoder may receive a codeword encoded using a tailless convolutional code (TLCC) with a known start state (e.g., bitstream 514). The decoder may then evaluate a set of decoding candidate paths through a trellis decoder that originate at the known start state of the TLCC and perform, for each of a plurality of the decoding candidate paths, a back trace from a respective end state to the known start state. The decoder may then select one of the decoding candidate paths based, at least in part, on path metrics generated while performing the back trace and decode the codeword and decode the codeword.

Figures 6, 7:
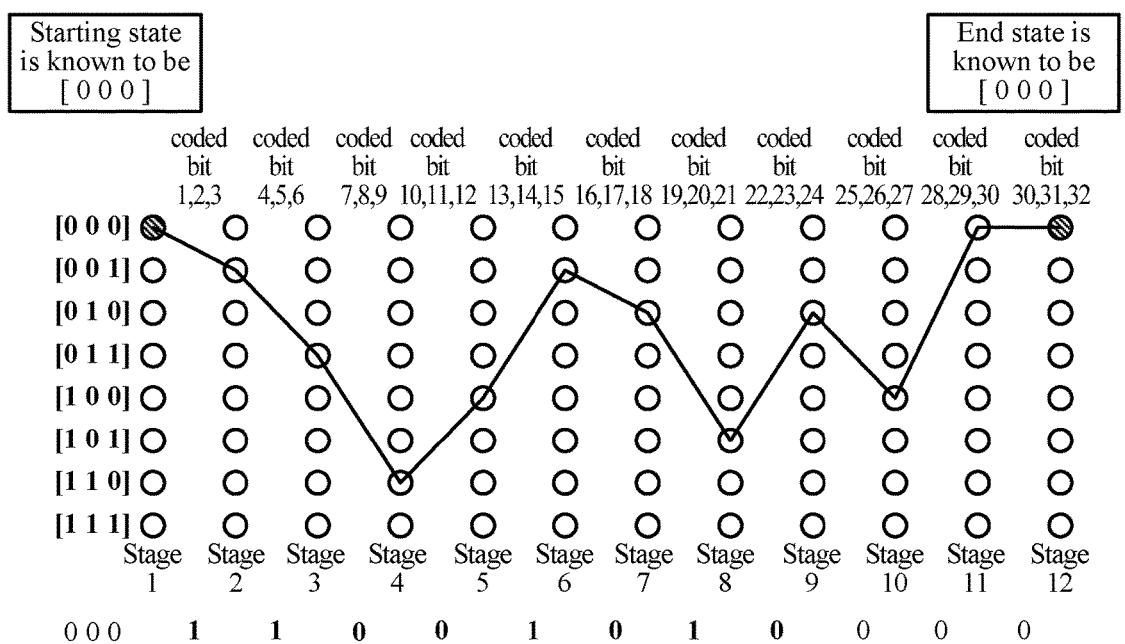
FIG. 6 illustrates an example of convolutional coding, in accordance with certain aspects of the present disclosure.
FIG. 7 illustrates an example of a Viterbi algorithm for decoding a convolutionally coded bit stream, in accordance with certain aspects of the present disclosure.

According to certain aspects, a convolutional coding algorithm may be used to encode a stream of bits (e.g., as described with respect FIG. 4) and generate an encoded codeword. FIG. 6 illustrates an example of convolutional coding, in which a stream of information bits is encoded. As illustrated, the encoding may start with a known sequence of bits (e.g., 000 in this example) and each encoded bit may be generated as a function of the previous bits. The same known sequence of bits is appended at the end as shown in FIG. 6.

As illustrated in FIG. 7, an encoded codeword may be decoded using a Trellis structure. In a Trellis structure, each stage in the Trellis has one of several states (e.g., 8 states if each bit is encoded based on previous three bits). Each transition from one stage to the other is a function of the previous bits and a "new" payload bit being encoded. In the illustrated example, since the first bit is a "1" the transition is from the state "000" in the first stage to the state "001" in the second stage (then from the "001" state in the second stage to "011" in the third stage, etc.). Thus there are only a finite number of valid decoding paths through the Trellis as the validity of a decoding path is a function of the bits used for encoding (i.e., the previous bits and the "new" bit being encoded). While FIG. 7 illustrates a trellis structure with 8 states, it should be understood that trellis structures may contain any number of states depending on how many "previous bits" are used to encode a "new" payload bit.

As described above, and as illustrated in FIG. 7, starting state and ending state are both known, a fact that may be exploited when decoding (e.g., any decoding paths through the Trellis that do not begin and end with the known state can be disqualified). For example, with reference to FIG. 7, assuming that the starting state is known to be [000] (e.g., as illustrated), any decoding paths that do not end with an ending state of [000] may be automatically disqualified. For example, a decoding path with a starting state of [000] and an ending state of [111] may be disqualified.

Figure 8:
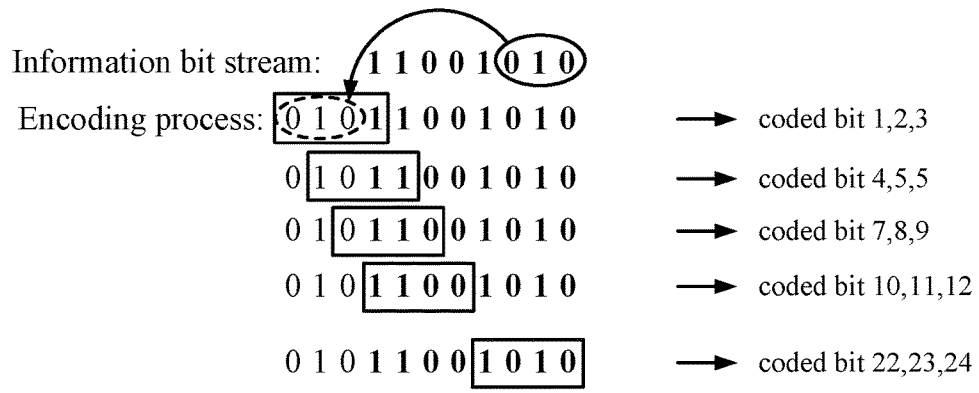
FIG. 8 illustrates an example of encoding via a tail biting convolutional code (TBCC), in accordance with certain aspects of the present disclosure.
Figure 9:
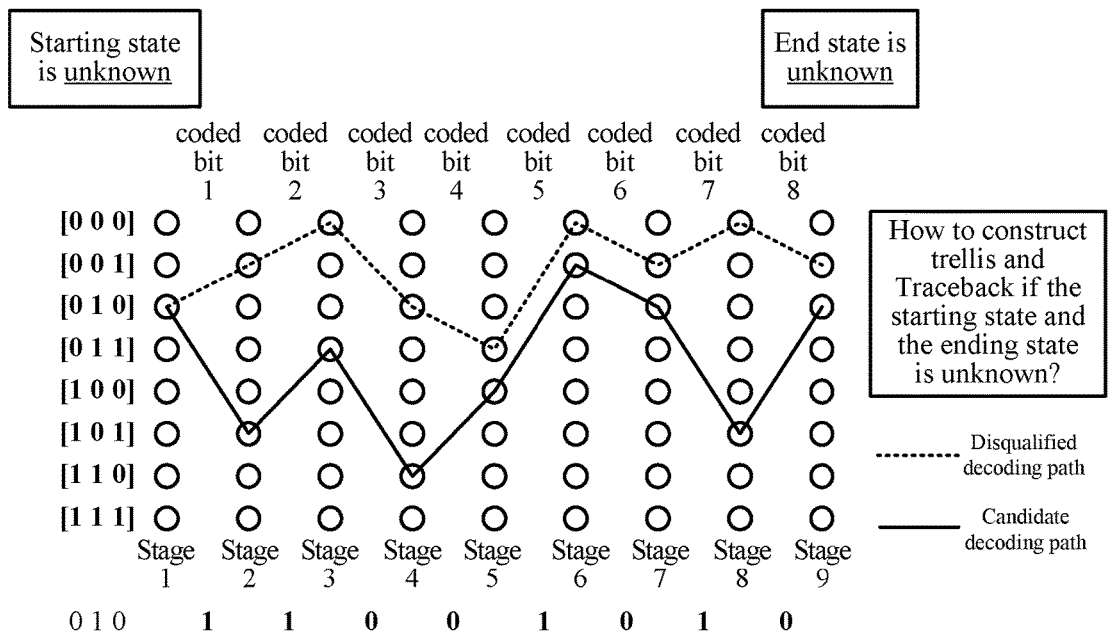
FIG. 9 illustrates an example of a Viterbi algorithm for decoding a TBCC encoded bit stream, in accordance with certain aspects of the present disclosure.

FIG. 8 illustrates an example of encoding a stream of bits using a tail biting convolutional code (TBCC). The TBCC algorithm is named such because the "tail" end of the bits is appended to the start of the encoded bit stream, for example, as illustrated. Thus, in this case, the starting and ending states are the same (as in FIG. 7), but the state is not fixed (rather it depends on the value of the tail bits). In the illustrated example, the value of the tail bits (and thus starting and end states) is "010." Thus, as illustrated by the solid line in FIG. 9, since the first bit is a "1" the transition is from the starting state "010" in the first stage to the state "101" in the second stage (then from the "101" state in the second stage to "011" in the third stage, etc.). Using a TBCC decoding Trellis, as illustrated in FIG. 9, any decoding paths that do not begin and end at the same state (although initially unknown) may be disqualified. For example, assume again the starting state is "010". In this example, however, illustrated by the dashed line in FIG. 9, the starting state (i.e., "010") does not match the ending state (e.g., "001"). Thus, this decoding path may be disqualified.

Figure 10:
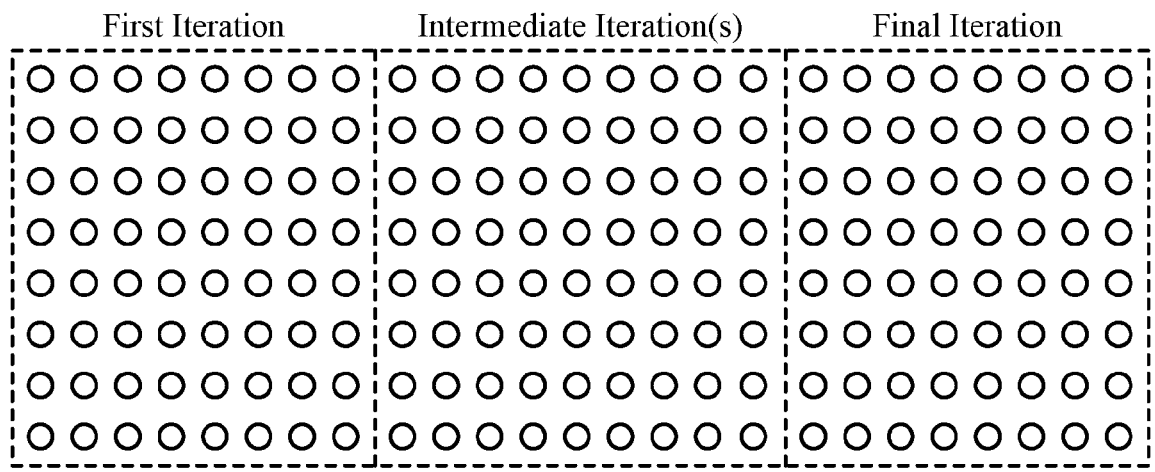
FIG. 10 illustrates an example iterative process of a Viterbi algorithm for decoding a TBCC encoded bit stream, in accordance with certain aspects of the present disclosure.

As illustrated in FIG. 10, one algorithm for decoding a TBCC encoded codeword is through a series of iterations. For example, in a first iteration, a decoder (e.g., decoder 324 and/or 516) may begin constructing a decoding trellis having each state starting with an equal weight. At the end of the trellis construction (e.g., after a final iteration), the decoder 324 and/or 516 may identify a number of best states, then perform a back trace output over a certain range of stages for the decoded bits and select a decoding path based on metrics (e.g., such as the path metrics, tail byte check, etc.) generated during these iterations to derive decoded bits.

Example Tailless Convolutional Codes

As noted above, codewords may be generated using a particular encoding scheme, such as a convolutional code (CC) encoding scheme or a tail-biting convolutional code (TBCC) encoding scheme, to encode a stream of bits. However, these encoding schemes have various disadvantages. For example, as noted above, when using a CC encoding scheme to generate a codeword, the encoding may start with a known sequence of bits (e.g., 000 in this example) and each encoded bit may be generated as a function of the previous bits. The same known sequence of bits is appended at the end of the codeword such that the codeword ends with a same state as it begins. However, appending the same known sequence of bits to the end of the codeword uses time and frequency resources for transmission of the codeword that could be used for transmitting other data.

Additionally, for TBCC, the complexity of the decoder is high since each codeword has M number of possible starting states and N number of possible ending states both of which are unknown at the decoder, where M and N depend on a constraint length at the encoder/decoder. This means that a TBCC decoder has to evaluate M×N different combinations of starting states and ending states. For example, for TBCC in LTE release 8, there are 64 possible starting states and 64 possible ending states, which means that when decoding a TBCC, the decoder has to evaluate 64×64 (i.e., 4096) different combinations of paths between ending states and starting states.

Thus, aspects of the present disclosure provide a new type of convolutional code known as a Tailless Convolutional Code (TLCC). According to aspects, unlike TBCCs, TLCCs are not required to have tail bits, thereby reducing decoder complexity and reducing the number of time/frequency resources needed to transmit a codeword. TLCCs also reduce decoder complexity by limiting the number of starting states to a single, known starting state. For example, instead of having M×N different combinations of starting and ending states like TBCC, due to having a single known starting state the number of possible starting state and ending state combinations is limited to, for example, N (e.g., 64 for LTE).

Figure 11:
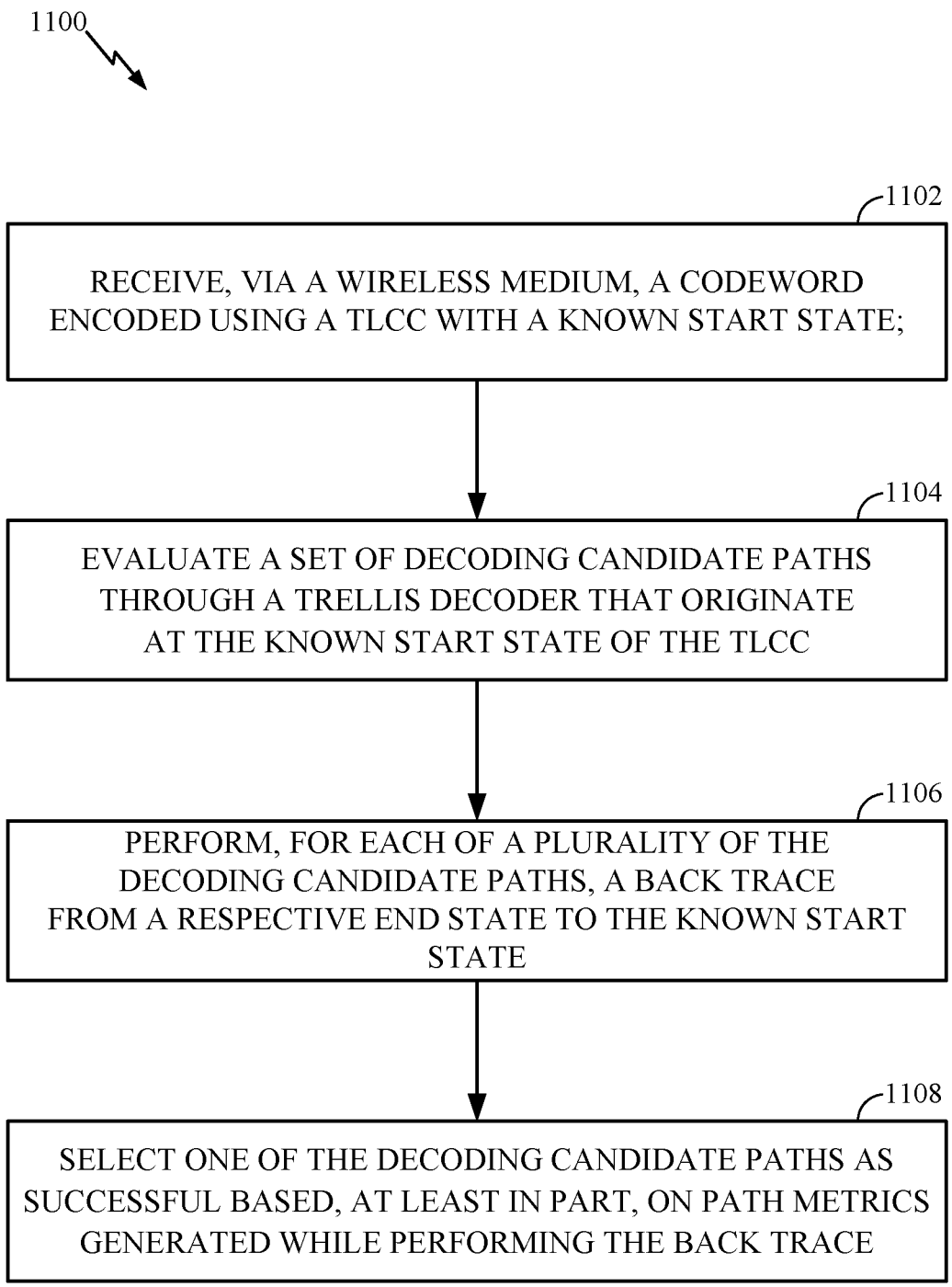
FIG. 11 illustrates example operations for wireless communications, in accordance with certain aspects of the present disclosure.

FIG. 11 illustrates example operations for wireless communications for decoding a tailless convolutional code (TLCC) codeword at a decoder, in accordance with certain aspects of the present disclosure. According to certain aspects, operations 1100 may be performed by any suitable wireless reception device, such as a base station (e.g., AP 100, 210), user terminal (e.g., AT 116, 250), and/or wireless device 302

The wireless reception device may include one or more components as illustrated in FIGS. 2 and 3 which may be configured to perform the operations described herein. For example, the antenna 224, receiver/transmitter 222, TX data processor 214, processor 230, and/or memory 232 of the access point 210, as illustrated in FIG. 2, may perform the operations described herein. Additionally or alternatively, the antenna 252, receiver/transmitter 254, TX data processor 238, modulator 280, processor 270, and/or memory 272 of the access terminal 250, as illustrated in FIG. 2, may perform the operations described herein. Additionally or alternatively, one or more of the processor 304, memory 306, transceiver 314, DSP 320, encoder 322, decoder 324, and/or antenna(s) 516 as illustrated in FIG. 5 may be configured to perform the operations described herein.

Operations 1100 begin at 1102 by receiving, via a wireless medium, a codeword encoded using a tailless convolutional code (TLCC) with a known start state. At 1104, the wireless reception device evaluates a set of decoding candidate paths through a trellis decoder that originate at the known start state of the TLCC. At 1106, the wireless reception device performs, for each of a plurality of the decoding candidate paths, a back trace from a respective end state to the known start state. At 1108, the wireless reception device selects one of the decoding candidate paths based, at least in part, on path metrics generated while performing the back trace.

As noted above, a wireless reception device may receive a codeword encoded using a tailless convolutional code (TLCC). According to certain aspects, tailless convolutional codes (TLCCs) may have the following properties. For example, TLCCs may start from a known starting state which is not a function of its ending state. For example a TLCC may start at a 0 state, but it may end at any of $2^M$ ending states, where M=K−1 and K is a constraint length at the encoder/decoder. According to aspects, the known start state may be pre-provisioned or may be derivable based on different parameters, as described below.

Additionally, as noted above, unlike CCs, TLCCs do not have appended tail bits. For example, to generate a TLCC codeword, P bits of a payload and C cyclic redundancy check (CRC) bits may be merged to form a sequence of N bits (e.g., N=P+C) to be encoded into a TLCC codeword. In some cases, the CRC may include additional bits (e.g., C' bits), such that the bits of the CRC is equal to C+C' bits. According to certain aspects, these additional C' bits may be used by the decoder in determining a correct decoding hypothesis (e.g., decoding path), as described in greater detail below. Additionally, since the total number of CRC bits is increased (e.g., by C' bits) and an error check capability against false alarm rates may be increased as well. For example, assume that a C-bit CRC allows a false alarm rate (FAR) of $2^{(-C)}$. Now, if the CRC bits are increased by C' bits (where C'>0), then the new FAR would be $2^{(-C-C')}$, which is less than the case without the additional CRC bits.

According to certain aspects, not having appended tail bits helps improve the energy per bit to noise power spectral density ratio ($E_b/N_0$) given the same codeword power and helps to save channel resources (e.g., by not having to transmit as many bits). For example, assume a fixed codeword power is allocated for a given K-bit payload and that T is the number of bits for a tail. Now, comparing the codeword corresponding to (K+T bits) (e.g., for CC) and the codeword corresponding to (K bits) (e.g., for TLCC), the same allocated codeword power needs to be distributed among codewords of different sizes. As a result, the Eb/N0 for the TLCC codeword will be higher than that for CC codeword. Therefore, the channel resources as well as the decoding (BLER) performance may be improved in the TLCC case (e.g., as compared to codewords utilizing tail bits).

In some cases, however, TLCCs may be generated with a partial tail comprising bits that carry no information and are typically of fixed values such as 0s. According to aspects, this partial tail may help back-tracing and reduce false alarms. In some cases, the same number of appended tail bits may be appended to the CRC, meaning the CRC is expanded (e.g., by C' bits) instead of appending fixed 0s as a tail.

It should be noted that TLCCs may be similar to TBCCs; however, unlike TBCCs, TLCCs do not have a tail-biting constraint (e.g., where an ending state must equal a starting state). The starting state of a TLCC is intended to be known a priori (or derivable based on certain parameters described below) without needing blind hypothesis testing like TBCC. That is, TLCCs have only one starting state hypothesis unlike TBCCs, which have $2^M$ starting state hypotheses.

For example, FIG. 12 shows a table illustrating the number of possible starting states, number of possible ending states, and the number of possible combinations between starting states and ending states at the decoder for CCs, TBCCs, and TLCCs using a constraint length similar to that of the LTE release 8 specification. As illustrated, CCs have one possible starting state, one possible ending state, and one possible combination for starting and ending states. For TBCCs, there may be 64 possible starting states, 64 possible ending states, and 64×64 possible combinations of starting and ending states. For TLCC, there may be one known starting state, 64 possible ending states, and 64 possible combinations between starting and ending states.

According to certain aspects, and as noted above, for TLCCs there is a single, known starting state, which, in some cases, may be set to a 0 (zero) state. According to aspects, the known start state may be pre-provisioned in, or communicated to, the wireless reception device or may be derivable based on different parameters. For example, the starting state at an encoder (e.g., as illustrated in FIG. 4) may be defined as a function of other parameters such that a zero-state may not always be the start state. For example, in some cases, the wireless reception device may derive starting state as function of a user equipment (UE) ID, a radio network temporary identifier (RNTI), a cell ID, a transmission mode, and/or a downlink control information (DCI) format. It should be noted that, in some cases, such a variable start-state feature (i.e., a start state as a function of other parameters) may be used in conjunction with, or may replace cell ID (e.g., cell radio network temporary identifier) scrambling on CRC bits (e.g., 16-bit C-RNTI scrambling on 16-bit CRC). For example, in some cases, the parameters known to the transmit (Tx) side need to be explicitly included in certain payloads for transmission. Now, with the possibility of a starting state other than 0, the Tx side may potentially not need to explicitly include a parameter in the payload. Instead, the Tx side may implicitly use the parameter as a starting state for the TLCC encoding and let the receive (Rx) side do blind hypothesis decoding to determine the most likely value for this implicit parameter. That is, for TLCCs with a variable starting state that is not explicitly signaled to the Rx, the Rx side (e.g., the wireless reception device) may implicitly determine the starting state through TLCC blind detection.

According to certain aspects, once the start state of the TLCC codeword is determined/derived (e.g., using the information/parameters described above), the wireless reception device may evaluate a set of decoding candidate paths through a trellis decoder that originate at the known start state. For example, the wireless reception device may construct a single iteration (i.e., with 1× the length of codeword) of a Viterbi trellis and evaluate a set of decoding candidate paths through the Viterbi trellis that originate at the known start state. According to certain aspects, no warm-up iteration or phase is needed by TLCC. That is, since TLCCs have a single, known starting state, a TLCC decoder trellis requires no "warm-up" iteration or phase, which is common in a TBCC decoder. For example, for TBCC, the starting state which is bitten by the tail is not explicitly signaled to the Rx. The Rx side therefore needs to run certain logic (e.g., increasing run-time complexity) to estimate such starting state based on the tail-biting criterion, known as the "warm-up" phase. Thus, with TBCCs, there are two aspects of impacts then: (1) there is run-time complexity (i.e., the "warm-up" phase) needed to estimate this starting state, and (2) since this is an "estimation" for the starting state, there is a risk that such estimation is inaccurate/incorrect. However, since TLCCs have known starting states in some cases, no "warm-up" phase is needed to estimate the starting state. That is, the wireless reception device is able to directly perform back traces of various decoding path candidates without first having to estimate the start state. This helps achiever a higher trellis quality and improved decoding performance, for example, in some cases, even better than the second and subsequent iterations of the trellis for TBCC.

According to certain aspects, the wireless reception device may then perform a back trace for each of a plurality of the decoding candidate paths from a respective end state to the known (e.g., derived) start state. For example, the wireless reception device may choose a particular end state and develop/derive a decoding path candidate by performing a back trace from the chosen end state to the known start state. According to aspects, during the back trace, the wireless reception device may generate path metrics for intermediate states between the end state and known start state. In some cases, these path metrics may be log likelihood ratios (LLRs), which indicate a probability of whether a particular state has a value of 0 (zero) or 1 (one). According to certain aspects, the wireless reception device may perform all of the back traces for the plurality of the decoding candidate paths in parallel.

According to aspects, during the back trace, the wireless reception device may prune the set of all possible decoding paths to determine a subset of successful or most-likely decoding path candidates. For example, pruning the set of all possible decoding paths may be based on a comparison between an error check value calculated (e.g., a calculated CRC) for bits of a particular decoding candidate path and an error check value transmitted with the codeword (e.g., a CRC value included in the codeword).

For example, the wireless reception device may compare an error check value calculated for bits of that particular decoding candidate path to an error check value transmitted with the codeword. If the error check value calculated for bits of that particular decoding candidate path matches the error check value transmitted within the codeword, that particular decoding candidate path may be added to the subset of decoding path candidates. However, if the error check value calculated for the bits of the particular decoding candidate path does not match the error check value transmitted within the codeword, that particular decoding candidate path may be pruned and not added to the subset of decoding path candidates. In some cases, as noted above, the CRC included in the codeword may include additional C' bits such that the total number of CRC bits is increased and an error check capability against false alarm rates may be increased as well. These additional C' bits may be used to more accurately prune decoding path candidates. Additionally, in some cases, the wireless reception device may further prune the set of all possible decoding candidate paths, based on path or state information in the TLCC codeword.

According to aspects, the wireless reception device may then select one of the decoding candidate paths in the subset of decoding path candidates based on which decoding candidate path in the list has a best path metric. For example, the wireless reception device may evaluate path metrics between the decoding candidate paths included on the subset and may choose the decoding candidate path with the best path metric. According to aspects, the wireless reception device may then decode the codeword using the selected decoding path candidate.

According to certain aspects, TLCC may achieve a significant reduction in decoding complexity by a factor of S, where S is equal to the number of states of the decoding trellis and is based on the constraint length K (e.g., $S=2^M$, where $M=K-1$ and K is the constraint length.) For example, given K=7 and S=64 (e.g., as in the 3GPP LTE spec), TLCC requires only 1/64 the decoding complexity as compared with TBCC, for example, which requires 64×64 independent trellises (e.g., for each of the 64 unknown starting states and 64 unknown ending states) as opposed to 64 independent trellises needed for TLCC (e.g., 64 unknown ending states traced back to a single, known starting state).

According to aspects, if a sub-optimal TBCC decoder is used (e.g., that does not construct S number of independent trellises, but that requires a warm-up stage), TLCC decoding complexity is still significantly lower in that no warm-up iteration/phase is needed. For example, a typical TBCC decoder employs 3 iterations of 64-state trellis construction. Assuming each iteration of 64-state decoding require a run-time complexity of G, then a typical TBCC decoder takes 3G complexity. In TLCC, first of all, the starting state is known, and no tail-biting is needed, so only one iteration is needed for decoding. Secondly, since the starting state is known, the trellis "quality" is as high as having a "matched filter" style of legacy TBCC decoder, which requires 64 independent but fixed-starting-state decoder. So theoretically, the TLCC requires only G/64 run-time complexity in terms of forward trellis construction. Further, while TLCC requires more back-tracings since there are 64 candidates ending states, back-tracing complexity is much less than forward construction complexity.

Additionally, for decoding performance (e.g., a block error ratio (BLER), TLCC outperforms sub-optimal TBCCs non-trivially, given same list size. In some cases, TLCC performance may be equal to TBCC when an optimal TBCC decoder is used. However, TLCC decoding requires only 1/S in complexity of an optimal TBCC decoder, as noted above.

Figures 13, 14:
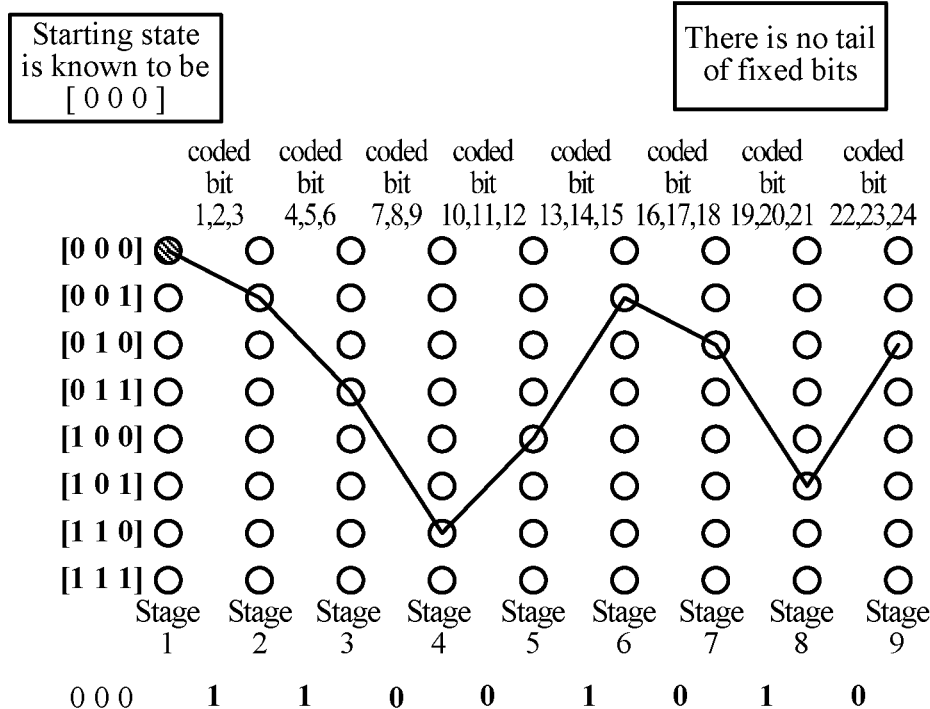
FIG. 13 illustrates an example of encoding via a tailless convolutional code (TLCC), in accordance with certain aspects of the present disclosure.
FIG. 14 illustrates an example of a Viterbi algorithm for decoding a TLCC encoded bit stream, in accordance with certain aspects of the present disclosure.

FIG. 13 illustrates an example of convolutional coding, similar to FIG. 6, in which a stream of information bits (e.g., 1 1 0 0 1 0 1 0) is encoded using a tailless convolutional code (TLCC). As illustrated, the encoding may start with a known sequence of bits (e.g., 000, in this example) and each encoded bit may be generated as a function of the previous bits. However, unlike FIG. 6, the same known sequence of bits is not appended at the end of the stream of information bits, hence, the name "tailless" convolutional code.

As illustrated in FIG. 14, an encoded TLCC codeword may be decoded using a Trellis structure. In a Trellis structure, each stage in the Trellis has one of several states (e.g., 8 states if each bit is encoded based on previous three bits). Each transition from one stage to the other is a function of the previous bits and a "new" payload bit being encoded. In the illustrated example, since the first bit is a "1" the transition is from the known start state "000" in the first stage to the state "001" in the second stage (then from the "001" state in the second stage to "011" in the third stage, etc.). Thus there are only a finite number of valid decoding paths through the Trellis as the validity of a decoding path is a function of the bits used for encoding (i.e., the previous bits and the "new" bit being encoded). While FIG. 14 illustrates a trellis structure with 8 states, it should be understood that trellis structures may contain any number of states depending on how many "previous bits" are used to encode a "new" payload bit.

As described above, and as illustrated in FIG. 14, the starting state is known (e.g., a priori or is derivable), a fact that may be exploited when decoding (e.g., any decoding paths through the Trellis that do not begin with the known starting state can be disqualified). For example, with reference to FIG. 14, assuming that the starting state is known to be [000] (e.g., as illustrated), any decoding paths that do not begin with the known start state of [000] may be automatically disqualified. For example, a decoding path with a starting state of [001] may be disqualified.

According to aspects, when decoding a TLCC codewords, for example, as illustrated in FIG. 14, the decoder may perform a back trace through trellis stages of the TLCC decoder from one of 64 possible ending states to the known starting state. That is, the decoder may blindly choose one of 64 possible ending states and perform a back trace through trellis stages of the TLCC based on the TLCC codeword. According to aspects, any decoding paths that, for example, do not start with the known starting state or fail their respective CRC may be pruned from the list of possible decoding paths, as described above. If one or more decoding paths survive pruning, the decoder may choose the decoding path with the best path metrics. That is, during decoding, the decoder may generate path metrics (e.g., one or more LLRs) and select the decoding path with the best (additive) path metrics. The decoder may then decode the TLCC codeword based on the selected decoding path.

Figure 15:
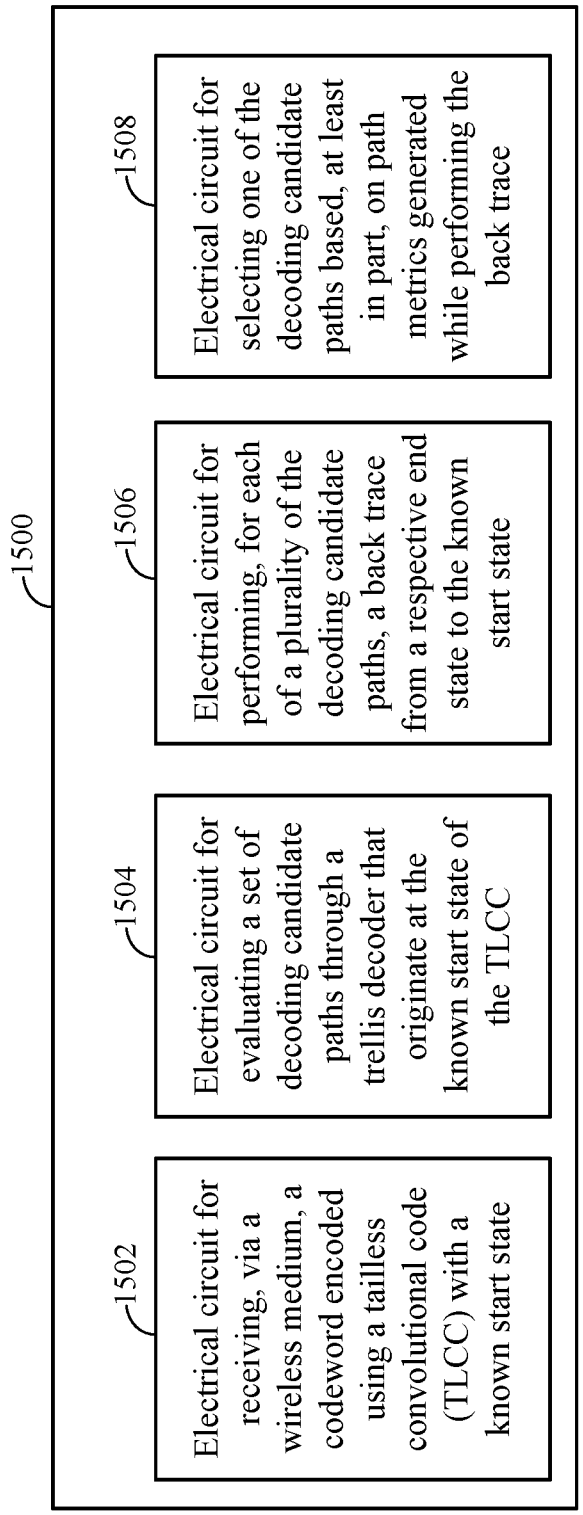
FIG. 15 illustrates a decoder configured to perform enhanced TLCC list decoding, in accordance with aspects of the present disclosure.

FIG. 15 illustrates a decoder 1500 configured to decode a codeword encoded using techniques presented herein, in accordance with aspects of the present disclosure. According to aspects, the decoder 1500 may comprise the decoder 324 and/or the decoder 516. As illustrated, the decoder 1500 comprises a number of electrical circuits configured to perform, for example, the operations 1100 illustrated in FIG. 11. For example, the decoder 1500 includes an electrical circuit 1502 for receiving, via a wireless medium, a codeword encoded using a tailless convolutional code (TLCC) with a known start state. Additionally, the decoder 1500 includes and electrical circuit 1504 for evaluating a set of decoding candidate paths through a trellis decoder that originate at the known start state of the TLCC. Additionally, the decoder 1500 includes and electrical circuit 1506 for performing, for each of a plurality of the decoding candidate paths, a back trace from a respective end state to the known start state. Additionally, the decoder 1500 includes and electrical circuit 1506 for selecting one of the decoding candidate paths based, at least in part, on path metrics generated while performing the back trace.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module (s), including, but not limited to a circuit, an application specific integrated circuit (ASIC), or processor.

For example, means for processing, means for generating, means for obtaining, means for evaluating, means for pruning, means for determining, means for deriving, means for merging, means for verifying, means for selecting, means for performing, means for decoding, and means for encoding may comprise a processing system, which may include one or more processors, such as the TX data processor 214, the processor 230, and/or the RX data processor 242 of the access point 210 illustrated in FIG. 2 or the TX data processor 238, the processor 270, and/or the RX data processor 260 of the user equipment 250 illustrated in FIG. 2. Additionally, means for transmitting and means for receiving may comprise a TMTR/RCVR 222 of the access point 210 or a TMTR/RCVR 254 of the user equipment 250.

According to certain aspects, such means may be implemented by processing systems configured to perform the corresponding functions by implementing various algorithms (e.g., in hardware or by executing software instructions) described above.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and/or write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage medium may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and BLU-RAY® media disc where disks usually reproduce data magnetically, while discs reproduce data optically with lasers. Combinations of the above should also be included within the scope of computer-readable media.

As used herein, a phrase referring to "at least one of" a list of items refers to any combination of those items, including single members. As an example, "at least one of: a, b, or c" is intended to cover: a, b, c, a-b, a-c, b-c, and a-b-c.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A method of wireless communications for decoding a tailless convolutional code (TLCC) codeword by a wireless reception device, comprising:
    receiving, via a wireless medium, a codeword encoded using a tailless convolutional code (TLCC) with a known start state, wherein the TLCC includes no tail bits;
    evaluating a set of decoding candidate paths through a trellis decoder that originate at the known start state of the TLCC;
    performing, for each of a plurality of the decoding candidate paths, a back trace from a respective end state to the known start state; and
    selecting one of the decoding candidate paths based, at least in part, on an error check value calculated for bits of the one decoding candidate path and an error check value transmitted within the codeword.

2. The method of claim 1, wherein the selecting is further based on state or path information included in the codeword.

3. The method of claim 1, wherein the known start state is pre-provisioned in the wireless reception device.

4. The method of claim 1, further comprising deriving the known start state from at least one of a UE ID, a radio network temporary identifier (RNTI), a cell ID, a transmission mode, or a downlink control information (DCI) format.

5. The method of claim 1, further comprising:
    pruning, based on path or state information in the codeword, the set of decoding candidate paths to determine a subset of decoding paths, and wherein the selected one decoding candidate path is selected from the subset of decoding paths.

6. The method of claim 1, wherein performing the back trace for each of the plurality of the decoding candidate paths is performed in parallel.

7. The method of claim 1, wherein the performing the back trace for each of a plurality of the decoding candidate paths is performed without first having to estimate the known start state.

8. The method of claim 1, wherein the known start state is not a function of an end state of the codeword.

9. An apparatus for wireless communications for decoding a tailless convolutional code (TLCC) codeword by a wireless reception device, comprising:
    at least one processor configured to:
        receive, via a wireless medium, a codeword encoded using a tailless convolutional code (TLCC) with a known start state, wherein the TLCC includes no tail bits;
        evaluate a set of decoding candidate paths through a trellis decoder that originate at the known start state of the TLCC;
        perform, for each of a plurality of the decoding candidate paths, a back trace from a respective end state to the known start state; and
        select one of the decoding candidate paths based, at least in part, on an error check value calculated for bits of the one decoding candidate path and an error check value transmitted within the codeword; and
    a memory coupled with the at least one processor.

10. The apparatus of claim 9, wherein the at least one processor is further configured to select based further on state or path information included in the codeword.

11. The apparatus of claim 9, wherein the known start state is pre-provisioned in the wireless reception device.

12. The apparatus of claim 9, wherein the at least one processor is further configured to derive the known start state from at least one of a UE ID, a radio network temporary identifier (RNTI), a cell ID, a transmission mode, or a downlink control information (DCI) format.

13. The apparatus of claim 9, wherein the at least one processor is further configured to:
- prune, based on path or state information in the codeword, the set of decoding candidate paths to determine a subset of decoding paths; and
- select the one decoding candidate path from the subset of decoding paths.

14. The apparatus of claim 9, wherein the at least one processor is further configured to perform the back trace for each of the plurality of the decoding candidate paths in parallel.

15. The apparatus of claim 9, wherein the at least one processor is further configured to perform the back trace for each of a plurality of the decoding candidate paths without first having to estimate the known start state.

16. The apparatus of claim 9, wherein the known start state is not a function of an end state of the codeword.

17. An apparatus for wireless communications for decoding a tailless convolutional code (TLCC) codeword by a wireless reception device, comprising:
- means for receiving, via a wireless medium, a codeword encoded using a tailless convolutional code (TLCC) with a known start state, wherein the TLCC includes no tail bits;
- means for evaluating a set of decoding candidate paths through a trellis decoder that originate at the known start state of the TLCC;
- means for performing, for each of a plurality of the decoding candidate paths, a back trace from a respective end state to the known start state; and
- means for selecting one of the decoding candidate paths based, at least in part, on an error check value calculated for bits of the one decoding candidate path and an error check value transmitted within the codeword.

18. The apparatus of claim 17, wherein the means for selecting select based further on state or path information included in the codeword.

19. The apparatus of claim 17, further comprising means for deriving the known start state from at least one of a UE ID, a radio network temporary identifier (RNTI), a cell ID, a transmission mode, or a downlink control information (DCI) format.

20. The apparatus of claim 17, further comprising means for pruning, based on path or state information in the codeword, the set of decoding candidate paths to determine a subset of decoding paths, wherein the means for selecting are configured to select the one decoding candidate path from the subset of decoding paths.

21. The apparatus of claim 17, wherein the means for performing perform the back trace for each of the plurality of the decoding candidate paths in parallel.

22. The apparatus of claim 17, wherein the means for performing perform the back trace for each of a plurality of the decoding candidate paths without first having to estimate the known start state, and wherein the known start state is not a function of an end state of the codeword.

23. A non-transitory computer-readable medium for wireless communications for decoding a tailless convolutional code (TLCC) codeword by a wireless reception device, comprising:
- instructions that, when executed by at least one processor, cause the at least one processor to:
  - receive, via a wireless medium, a codeword encoded using a tailless convolutional code (TLCC) with a known start state, wherein the TLCC includes no tail bits;
  - evaluate a set of decoding candidate paths through a trellis decoder that originate at the known start state of the TLCC;
  - perform, for each of a plurality of the decoding candidate paths, a back trace from a respective end state to the known start state; and
  - select one of the decoding candidate paths based, at least in part, on an error check value calculated for bits of the one decoding candidate path and an error check value transmitted within the codeword.

24. The non-transitory computer-readable medium of claim 23, wherein the instructions for selecting cause the at least one processor to select based further on state or path information included in the codeword.

25. The non-transitory computer-readable medium of claim 23, further comprising instructions that cause the at least one processor to derive the known start state from at least one of a UE ID, a radio network temporary identifier (RNTI), a cell ID, a transmission mode, or a downlink control information (DCI) format.

26. The non-transitory computer-readable medium of claim 17, further comprising instructions that cause the at least one processor to prune, based on path or state information in the codeword, the set of decoding candidate paths to determine a subset of decoding paths, wherein the instructions for selecting cause the at least one processor to select the one decoding candidate path from the subset of decoding paths.

* * * * *